(12) United States Patent
Suda

(10) Patent No.: US 7,678,509 B2
(45) Date of Patent: *Mar. 16, 2010

(54) METHOD OF PRODUCING PHASE SHIFT MASKS

(75) Inventor: Hideki Suda, Hachioji (JP)

(73) Assignee: Hoya Corporation, Tokyo (JP)

( * ) Notice: Subject to any disclaimer, the term of this patent is extended or adjusted under 35 U.S.C. 154(b) by 981 days.

This patent is subject to a terminal disclaimer.

(21) Appl. No.: 10/567,760

(22) PCT Filed: Aug. 9, 2004

(86) PCT No.: PCT/JP2004/011712

§ 371 (c)(1),
(2), (4) Date: Feb. 10, 2006

(87) PCT Pub. No.: WO2005/017621

PCT Pub. Date: Feb. 24, 2005

(65) Prior Publication Data

US 2006/0292454 A1    Dec. 28, 2006

(30) Foreign Application Priority Data

Aug. 15, 2003   (JP)   ............................. 2003-293835

(51) Int. Cl.
G03F 1/00    (2006.01)
G03F 1/14    (2006.01)
(52) U.S. Cl. ........................................................ 430/5
(58) Field of Classification Search .................... 430/5; 216/12
See application file for complete search history.

(56) References Cited

U.S. PATENT DOCUMENTS

| 6,004,699 | A | * | 12/1999 | Yasuzato et al. | ............... | 430/5 |
| 6,030,729 | A | * | 2/2000 | Ito et al. | ........................ | 430/5 |
| 6,576,374 | B1 | * | 6/2003 | Kim | .............................. | 430/5 |
| 7,314,690 | B2 | * | 1/2008 | Okubo et al. | .................. | 430/5 |

(Continued)

FOREIGN PATENT DOCUMENTS

JP    6-175346 A    6/1994

(Continued)

Primary Examiner—Mark F Huff
Assistant Examiner—John Ruggles
(74) Attorney, Agent, or Firm—Sughrue Mion, PLLC

(57) ABSTRACT

A light-shielding film pattern 2a having a main opening 5 and auxiliary openings 6 is formed in a first process and, then, recess etching of a transparent substrate (formation of a substrate etched portion 8) is performed in a second process. Thus, the main opening and auxiliary openings can be simultaneously exposed in the first process and the positioning accuracy of them becomes excellent. Patterning of a light-shielding film 2 is performed by the use of an etching mask layer 3a and therefore the processing accuracy of the light-shielding film becomes excellent. The etching mask layer 3a is removed in a third process as the final process and thus the light-shielding film pattern 2a can be protected by the etching mask layer 3a upon recess-etching the transparent substrate in the second process. Thus, it is possible to prevent damage to the light-shielding film pattern 2a in the recess etching of the transparent substrate. Specifically, the etching mask layer 3a itself is damaged in the recess etching of the transparent substrate and this etching mask layer 3a is removed in the third process, causing no problem.

13 Claims, 6 Drawing Sheets

U.S. PATENT DOCUMENTS

2007/0190434 A1 * 8/2007 Suda .............................. 430/5

FOREIGN PATENT DOCUMENTS

| JP | 7-020625 A | 1/1995 |
| JP | 10-83066 A | 3/1998 |
| JP | 10-239827 A | 9/1998 |
| JP | 10-319569 A | 12/1998 |

* cited by examiner (1)

(2)

(3)

(4)

METHOD OF PRODUCING PHASE SHIFT MASKS

TECHNICAL FIELD

This invention relates to a photomask for use in, for example, the semiconductor device manufacturing process or the like and, in particular, relates to a method of manufacturing an auxiliary pattern type phase shift mask that enables high-resolution pattern transfer.

BACKGROUND ART

Phase shift masks are used as one of super-resolution techniques in the photolithography in recent years. As the phase shift masks, various kinds of phase shift masks are proposed. Among them, an auxiliary pattern type phase shift mask is used as a phase shift mask for forming an isolated pattern such as a contact hole.

FIG. 3, (*a*) is a plan view of an auxiliary pattern type phase shift mask and FIG. 3, (*b*) is a sectional view taken along dotted line A in FIG. 3, (*a*). As shown in these figures, the auxiliary pattern type phase shift mask has, on a transparent substrate 20, a main opening 22 formed in a light-shielding film 21 and auxiliary openings 23 provided at the peripheral portion thereof. Further, in order that light passing through the main opening 22 and light passing through each auxiliary opening 23 have a phase difference of about 180 degrees, the auxiliary pattern type phase shift mask has, for example, a substrate etched portion 24 obtained by etching the substrate to a predetermined depth at a portion corresponding to the main opening. It is noted here that the fine line width and forming positions of the auxiliary openings 23 are set such that the light passing through the auxiliary openings 23 is prevented from resolving a resist on a transfer-target substrate.

As a method of manufacturing such an auxiliary pattern type phase shift mask, the following method, for example, is described in Japanese Unexamined Patent Application Publication (JP-A) No. H7-20625 (hereinafter referred to as Patent Document 1).

At first, referring to FIG. 4, description will be made about a conventional auxiliary pattern type phase shift mask manufacturing method (hereinafter referred to as Conventional Method 1) in the invention described in Patent Document 1.

A light-shielding film 21 and a first resist film 25 are formed in order on a transparent substrate 20 (see FIG. 4, (1)).

Then, a pattern corresponding to a main opening and auxiliary openings is exposed by the use of, for example, an electron-beam exposure apparatus and developed to thereby form a first resist pattern 25*a*. Then, the light-shielding film is etched using the first resist pattern 25*a* as a mask to thereby form a light-shielding film pattern 21*a* having a main opening 22 and auxiliary openings 23 (see FIG. 4, (2)). Thereafter, the remaining first resist pattern is stripped (see FIG. 4, (3)).

Then, a second resist film 26 is formed on the surface of the substrate thus obtained (see FIG. 4, (4)).

A pattern corresponding to the main opening is exposed onto the second resist film by the use of, for example, the electron-beam exposure apparatus and developed to thereby form a second resist pattern 26*a* (FIG. 4, (5)). By etching the substrate using the resist pattern 26*a* as a mask, a substrate etched portion 24 is formed (FIG. 4, (5)). Thereafter, the remaining second resist pattern 26*a* is stripped. Thus, an auxiliary pattern type phase shift mask is completed (FIG. 4, (6)).

According to Patent Document 1 as described above, the main opening and the auxiliary openings are so close to each other. Therefore, it is difficult to write both the main opening and the auxiliary openings on the same resist film by electron-beam writing. In order to solve this problem, Patent Document 1 proposes the following method (hereinafter referred to as Conventional Method 2). This method will be described with reference to FIG. 5.

A light-shielding film 21 and a first resist film 27 are formed in order on a transparent substrate 20 (see FIG. 5, (1)).

Then, a pattern corresponding to a main opening is exposed by the use of, for example, an electron-beam exposure apparatus and developed to thereby form a first resist pattern 27*a*. Then, the light-shielding film is etched using the first resist pattern 27*a* as a mask to thereby form a light-shielding film pattern 21*b* having a main opening 22 (see FIG. 5, (2)).

Subsequently, by etching the substrate using the first resist pattern 27*a* and the light-shielding film pattern 21*b* as a mask, a substrate etched portion 24 is formed (see FIG. 5, (2)). Thereafter, the remaining first resist pattern 27*a* is stripped (see FIG. 5, (3)).

Then, a second resist film 28 is formed on the surface of the substrate thus obtained (see FIG. 5, (4)).

A pattern corresponding to auxiliary openings is exposed onto the second resist film 28 by the use of, for example, the electron-beam exposure apparatus and developed to thereby form a second resist pattern 28*a*. Then the light-shielding film 21 is etched using the second resist pattern as a mask (FIG. 5, (5)). Thereafter, the remaining second resist pattern 28*a* is stripped. Thus, an auxiliary pattern type phase shift mask is completed (FIG. 5, (6)).

DISCLOSURE OF THE INVENTION

However, the problem about Conventional Method 1 described in Patent Document 1, i.e. the problem that the main opening and the auxiliary openings are so close to each other so that it is difficult to write both the main opening and the auxiliary openings on the same resist film by electron-beam writing, is being solved by the progress of the electron-beam exposure technique in recent years. On the other hand, when Conventional Method 2 is adopted, since the main opening and the auxiliary openings are written in the separate processes, it is problematically difficult to overlay those openings with each other with high positioning accuracy. The fact has been made clear that Conventional Method 1 is better from this aspect.

However, Conventional Method 1 has the following problem. Specifically, although the second resist pattern is formed for recess-etching the substrate at the main opening, positioning between the formation (writing) of the second resist pattern and the main opening is difficult so that a slight position offset often occurs to expose the light-shielding film. Further, when the substrate is recess-etched using the second resist pattern as a mask, the shape of the second resist pattern is degraded to expose the light-shielding film. When the substrate is recess-etched under those conditions, the quality is problematically deteriorated such that the exposed light-shielding film is damaged to degrade its shape and the reflectance of the light-shielding film normally having a surface reflection preventing film changes only at such a degraded portion. In FIG. 6, a portion identified by arrows is a portion where the light-shielding film 21 is damaged. In the figure, 26*a* denotes the second resist pattern.

It is an object of this invention to provide a manufacturing method of an auxiliary pattern type phase shift mask, which can manufacture it without deteriorating the quality.

3

This invention has the following aspects.

(First Aspect)

A method of manufacturing a phase shift mask having, on a transparent substrate, a main opening formed by partly removing a light-shielding film and an auxiliary opening provided at a peripheral portion of said main opening, wherein the transparent substrate is partly removed in a depth direction such that phases of light passing through the main opening and light passing through the auxiliary opening differ from each other by a predetermined angle, comprising:

a first process including a step of preparing a photomask blank having the light-shielding film, a thin film for forming an etching mask layer, and a first resist film which are formed in this order on the substrate, a step of exposing a pattern corresponding to the main opening and the auxiliary opening onto the first resist film and then developing to form a first resist pattern, a step of, using said first resist pattern as a mask, etching the thin film to form the etching mask layer, a step of, using the etching mask layer as a mask, etching the light-shielding film, and a step of stripping the remaining first resist pattern, a second process including a step of forming a second resist film on the substrate obtained in the first process, a step of exposing a pattern corresponding to one of the main opening and the auxiliary opening and then developing to form a second resist pattern, a step of, using the second resist pattern as a mask, etching part of the transparent substrate to a depth such that the phases of the light passing through the main opening and the light passing through the auxiliary opening differ from each other by the predetermined angle, and a step of stripping the remaining second resist pattern, and a third process including a step of removing a required part of or whole of the etching mask layer in the substrate obtained in the second process.

(Second Aspect)

A phase shift mask manufacturing method according to the first aspect wherein the light-shielding film is made of a material that is etchable by a fluorine-based etching medium and the light-shielding film is etched by the fluorine-based etching medium.

BEST MODE FOR CARRYING OUT THE INVENTION

According to this invention, at first, a light-shielding film pattern having a main opening and auxiliary openings is formed in a first process and, then, a transparent substrate is recess-etched in a second process. Accordingly, the main opening and auxiliary openings can be simultaneously exposed in the first process and thus the positioning accuracy of them becomes excellent. Further, patterning of a light-shielding film is carried out by the use of an etching mask layer and therefore the processing accuracy of the light-shielding film becomes excellent. Further, the etching mask layer is removed in a third process as the final process. Therefore, upon recess-etching the transparent substrate in the second process, the light-shielding film can be protected by the etching mask layer and thus, the light-shielding film can be prevented from being damaged upon recess-etching the transparent substrate. Specifically, the etching mask layer itself is damaged in the recess etching of the transparent substrate and this etching mask layer is removed in the third process, and therefore, no problem arises.

In this invention, the light-shielding film is one in a range including a film having a function of transmitting substantially no exposure light, for example, a light-shielding film made of chromium, a chromium compound, or the like, and a film having a function of transmitting exposure light at a predetermined transmittance, such as a light semi-transmissive film containing, for example, silicon, oxygen, nitrogen, carbon, or the like in a metal.

On the other hand, the transparent substrate is one in a range including a glass substrate such as a quartz substrate, a glass substrate comprising a transparent phase shift film made of $SiO_2$ (including SOG) or the like thereon, and a substrate having, between the glass substrate and the phase shift film, another transparent film such as a transparent etching stopper.

Embodiment 1

Hereinbelow, this invention will be described in detail in terms of an embodiment.

Figure 1:
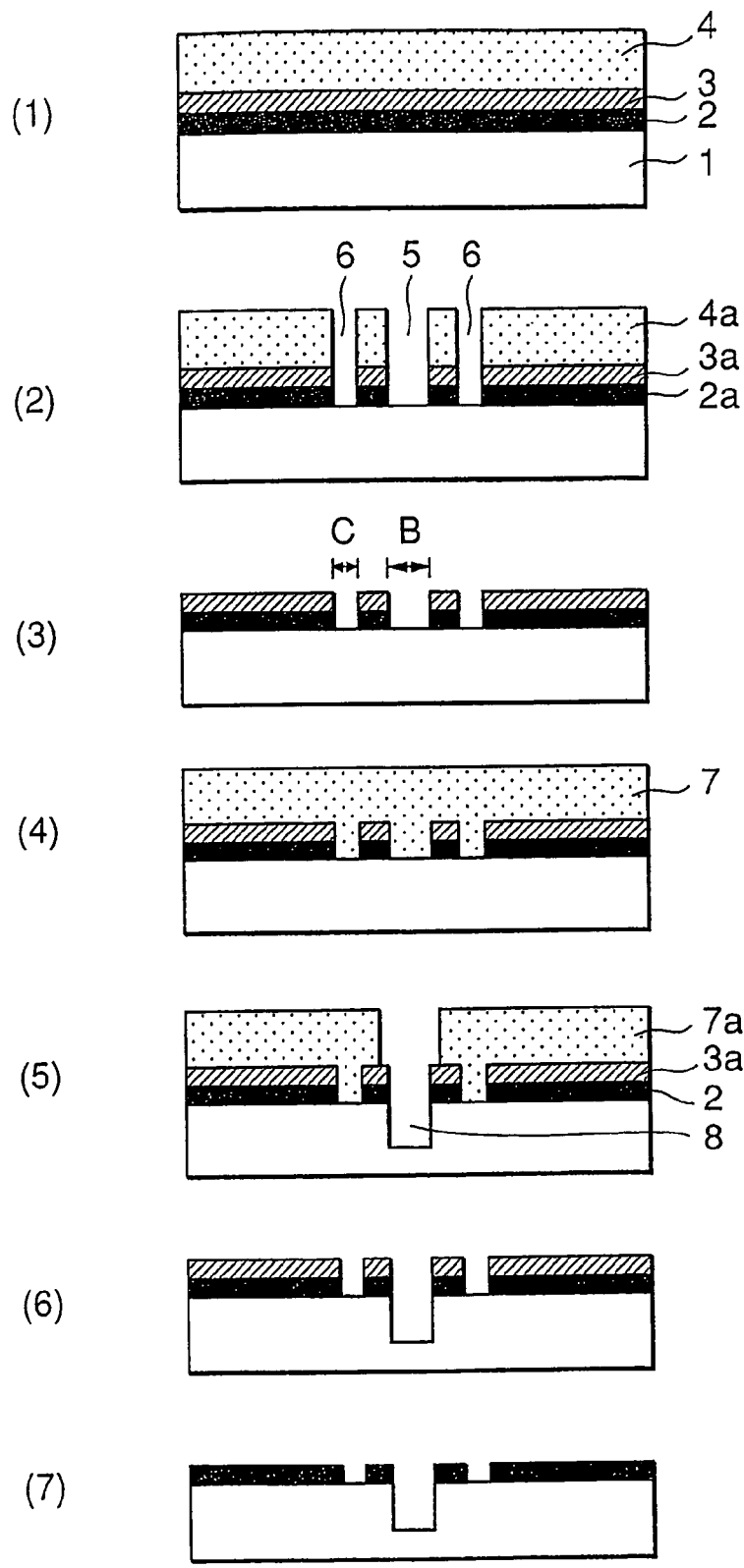
FIG. 1 is an exemplary sectional view for explaining auxiliary pattern type phase shift mask manufacturing processes according to Embodiment 1 of this invention.

FIG. 1 shows auxiliary pattern type phase shift mask manufacturing processes according to this embodiment. Hereinbelow, this embodiment will be described with reference to FIG. 1.

(First Process)

A light-shielding film 2 made of $MoSi_2$, a thin film 3 made of Cr for forming an etching mask, and a first resist film 4 made of a positive electron-beam resist were formed in this order on a transparent substrate 1 made of quartz (see FIG. 1, (1)).

Then, pattern data corresponding to a main opening and auxiliary openings were written by the use of an electron-beam exposure apparatus (JBX9000MV manufactured by JEOL Ltd.) and developed to thereby form a first resist pattern 4a. It is noted here that a pattern dimension B of the main opening was 1.0 μm and a pattern dimension C of each auxiliary opening was 0.2 μm. Subsequently, using the first resist pattern 4a as a mask, the etching mask layer was dry-etched with $Cl_2+O_2$ used as an etching gas and then the light-shielding film was dry-etched by changing the etching gas to $CF_4+O_2$. Thus, an etching mask layer 3a and a light-shielding film pattern 2a each having a main opening 5 and auxiliary openings 6 were formed (see FIG. 1, (2)). Thereafter, the remaining first resist pattern 4a was stripped and then cleaning was carried out (see FIG. 1, (3)).

In the foregoing process, since selection was made of respective materials such that the etching mask layer had resistance to the dry etching of the light-shielding film, the processing accuracy of the light-shielding film was excellent. Further, since the pattern data corresponding to the main opening and auxiliary openings were written by the use of the foregoing electron-beam exposure apparatus, it was possible to form both the main opening and auxiliary openings with high accuracy. Owing to the development of the electron-beam writing technique in recent years, such as the adoption of the high acceleration voltage and the utilization of the proximity effect correction function, the foregoing electron-beam writing apparatus was able to form, simultaneously and yet faithfully to the design values (within ±5 nm), the patterns like in the embodiment as described above, which would have otherwise been unable to be formed. Further, the main opening and auxiliary openings were written in the same writing process. Therefore, the overlay accuracy was able to be achieved within ±30 nm by ensuring alignment by the use of the same writing apparatus, so that the positioning accuracy of them was also excellent.

(Second Process)

Then, a second resist film 7 made of a positive electron-beam resist was formed on the surface of the substrate thus obtained (see FIG. 1, (4)).

Then, a pattern corresponding to the main opening was exposed onto the second resist film 7 by the use of the same electron-beam exposure apparatus as described above and then developed to thereby form a second resist pattern 7a (FIG. 1, (5)). Subsequently, using the resist pattern 7a as a mask, the transparent substrate 1 was dry-etched with $CF_4+O_2$. Thus, a substrate etched portion 8 was formed.

In this event, the resist pattern 7a was slightly offset from the main opening 5 so that the etching mask layer 3a was exposed a little. Further, the shape of the resist pattern 7a was degraded as the etching proceeded. As a consequence, the exposed portion of the etching mask layer 3a was enlarged and damage to the etching mask layer 3a was caused. However, there was no influence to the underlying light-shielding film 2.

Thereafter, the remaining second resist pattern 7a was stripped and cleaning was carried out (FIG. 1, (6)).

(Third Process)

Next, the etching mask layer was removed by the use of an etchant containing ceric ammonium nitrate and perchloric acid and cleaning was carried out. Thus, an auxiliary pattern type phase shift mask as completed (FIG. 1, (7)).

Specifically, in this embodiment, use is made of respective materials such that the light-shielding film and the transparent substrate each have resistance to the etching of the etching mask layer. This makes it possible to remove the etching mask layer in the third process.

This invention is not limited to the foregoing embodiment.

In the foregoing embodiment, the transparent substrate is recess-etched at the main opening. However, etching may be carried out at the auxiliary openings instead of at the main opening. It is noted here that the dimension of each auxiliary opening is so small that the etching at the main opening is preferable in view of the processing accuracy.

Further, in the foregoing embodiment, the glass substrate is etched to shift the phase. However, a phase shift thin film formed on the glass substrate may be etched instead.

Further, the materials of the light-shielding film and the etching mask layer are not limited to the foregoing materials.

Selection can be properly made of respective materials such that the etching mask layer has resistance to the etching of the light-shielding film and can be selectively removed finally. For example, as a combination of the etching mask layer and the light-shielding film, it is possible to consider a combination of a material that is etchable by a fluorine-based etching medium and a material that is etchable by a chlorine-based etching medium. As the material etchable by the chlorine-based etching medium, use is, for example, made of a metal such as chromium, tantalum, titanium, aluminum, hafnium, vanadium, or zirconium, an alloy of one kind or two or more kinds of them, a metal compound containing one kind or two or more kinds of oxygen, nitrogen, carbon, fluorine, etc. in such a metal or alloy, or a stacked film of them. As the material etchable by the fluorine-based etching medium, use may be made of a silicide of a high melting point metal, for example, a silicide of molybdenum, tungsten, tantalum, or the like, or a material containing one kind or two or more kinds of oxygen, nitrogen, carbon, fluorine, etc. in such a silicide. These materials may be used for either the etching mask layer or the light-shielding film. However, the glass substrate is etched by the fluorine-based etching medium. If the transparent substrate is etched by the etching medium for use in removal of the etching mask layer, the transparent substrate is damaged. In consideration of this, it is preferable that the material having resistance to the fluorine-based etching medium and etchable by the chlorine-based etching medium is selected for the etching mask layer while the material etchable by the fluorine-based etching medium is selected for the light-shielding film. The etching medium represents a dry etching gas in the case of dry etching and an etching solution in the case of wet etching.

For etching the main opening and auxiliary openings, dry etching is preferable in view of the processing accuracy. Wet etching may be used for removing the etching mask. However, in the case of leaving part of the etching mask as will be described later and further when the processing accuracy is required for the remaining pattern, dry etching can be selected.

The light-shielding film may be a light semi-transmissive film. As the light semi-transmissive film, use is, for example, made of a material containing oxygen, nitrogen, carbon, fluorine, or the like in a metal such as chromium, tantalum, titanium, aluminum, hafnium, vanadium, or zirconium, or in an alloy of one kind or two or more kinds of them, or a material containing one kind or two or more kinds of oxygen, nitrogen, carbon, fluorine, etc. in a silicide of a high melting point metal, for example, a silicide of molybdenum, tungsten, tantalum, or the like. Further, this light semi-transmissive film may be a film where a phase difference is adjusted to a predetermined angle (e.g. about 180 degrees).

Furthermore, the light-shielding film is not limited to the single layer but may be in the form of a plurality of layers that exhibit the function of the light-shielding film. In this case, it is also possible to combine with known functional layers such as reflection preventing films on the front and back sides.

In the foregoing embodiment, the etching mask layer is entirely removed in the third process. However, it may be partly left depending on the purpose. For example, when the light-shielding film is a light semi-transmissive film, it is considered to form the etching mask layer as a film that substantially shields exposure light or a film that substantially shields exposure light in the form of a stacked layer with the light-shielding film and to leave the etching mask layer in a non-transfer region, a region where no pattern is formed, a region where a mark is formed, and so on.

Figure 2:
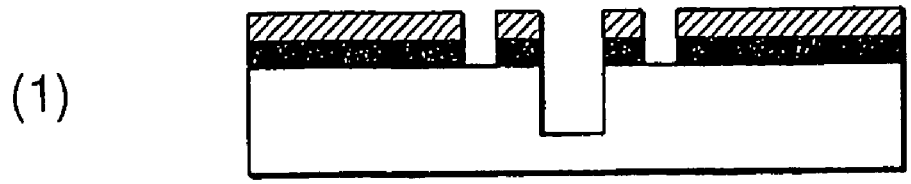
FIG. 2 is an exemplary sectional view for explaining a manner of partly leaving an etching mask layer in auxiliary pattern type phase shift mask manufacturing processes of this invention.
Figure 2:
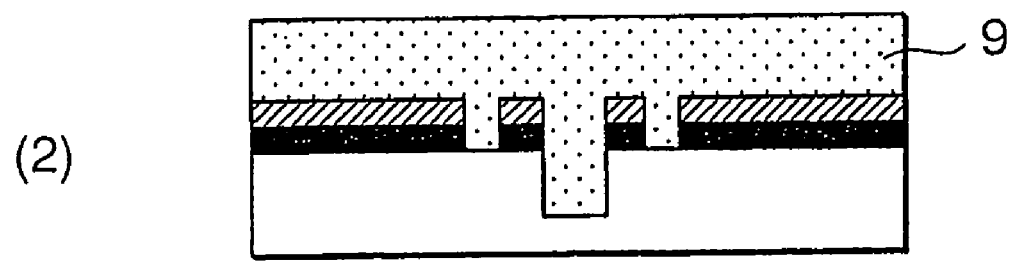
Figure 2:
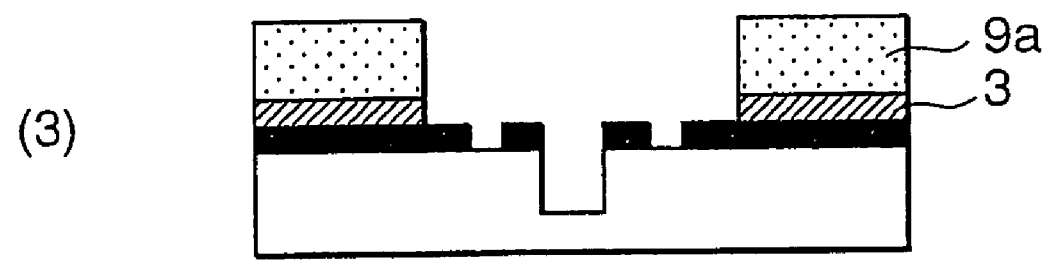
Figure 2:
Figure 3:
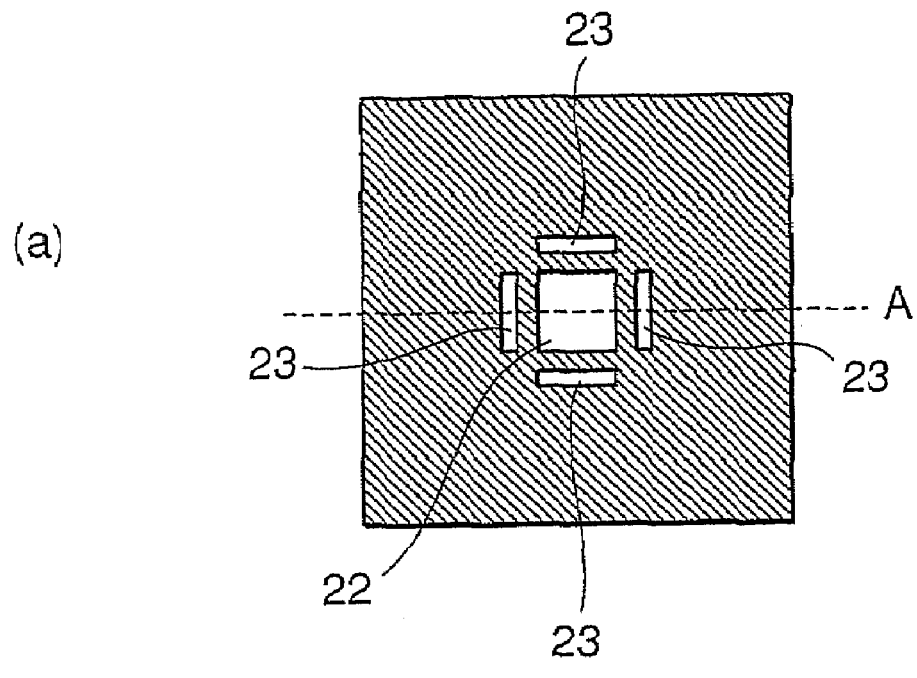
FIG. 3 is a figure for explaining an auxiliary pattern type phase shift mask, wherein FIG. 3, (a) is a plan view of the auxiliary pattern type phase shift mask and FIG. 3, (b) is a sectional view taken along dotted line A in FIG. 3, (a).
Figure 3:
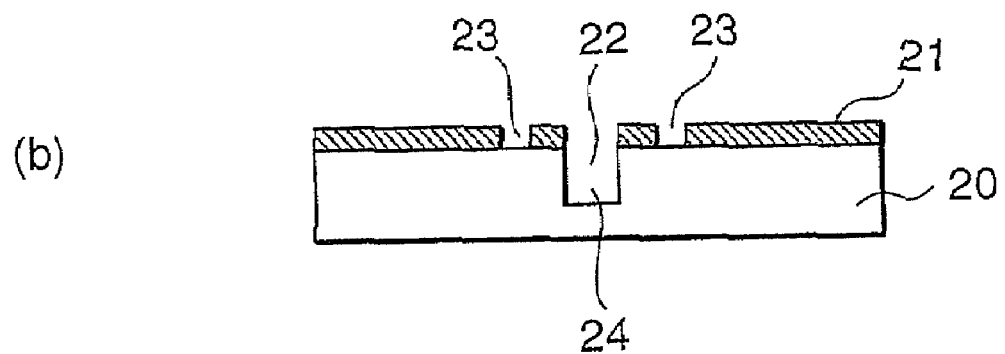
Figure 4:
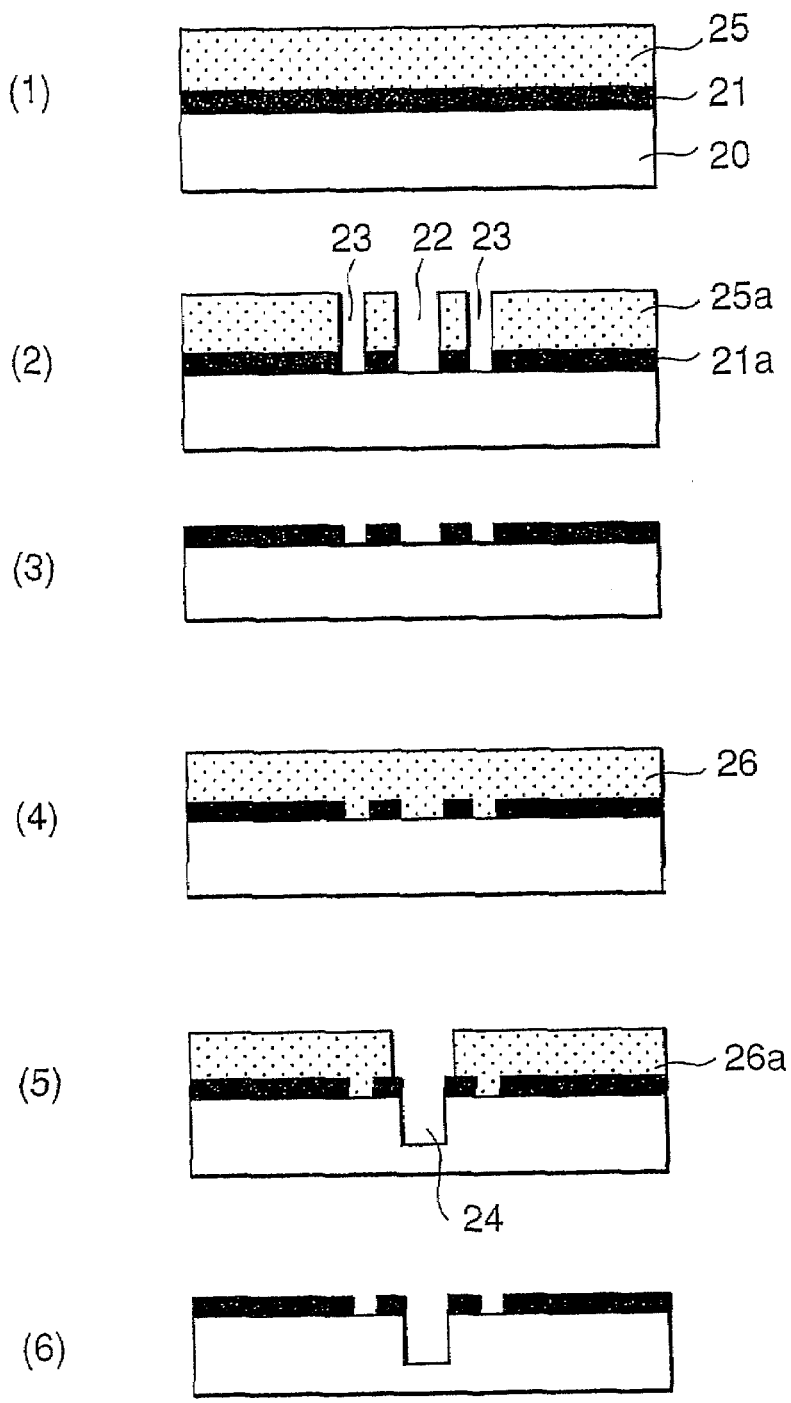
FIG. 4 is an exemplary sectional view for explaining conventional auxiliary pattern type phase shift mask manufacturing processes (Conventional Method 1).
Figure 5:
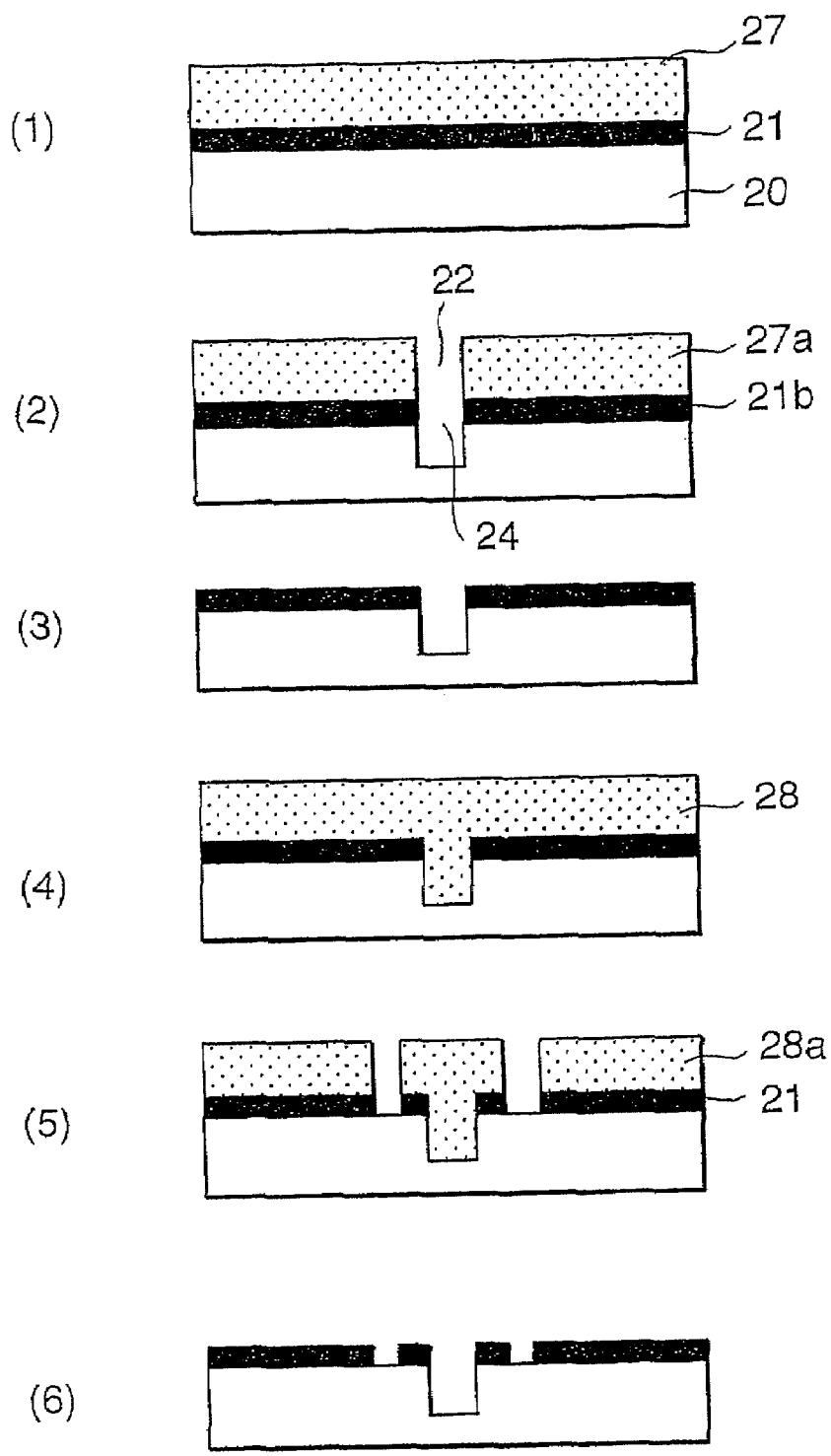
FIG. 5 is an exemplary sectional view for explaining conventional auxiliary pattern type phase shift mask manufacturing processes (Conventional Method 2).
Figure 6:
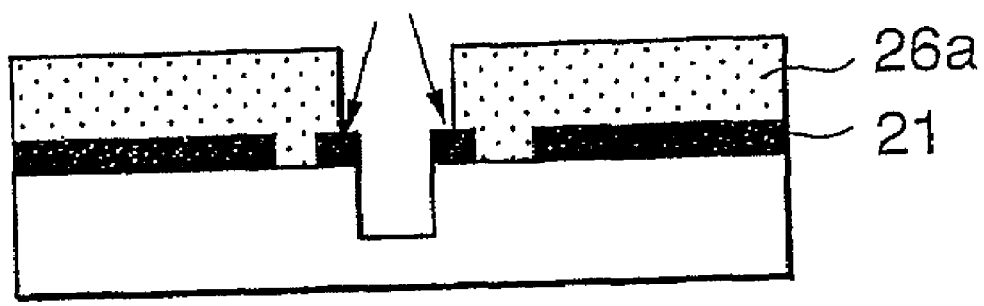
FIG. 6 is an exemplary sectional view for explaining a problem of the conventional auxiliary pattern type phase shift mask manufacturing processes (Conventional Method 1).

In this case, as shown in FIG. 2, with respect to the substrate obtained at the completion of the third process in the foregoing embodiment (FIG. 2, (1)), a third resist pattern 9 is formed. Successively, pattern exposure corresponding to part of the etching mask layer to be left is carried out and then developing is performed to thereby form a third resist pattern 9a covering the part of the etching mask layer to be left (FIG. 2, (3)). Using the third resist pattern 9a as a mask, the etching mask layer 3 is etched (FIG. 2, (3)). Finally, the remaining third resist pattern 9a is stripped and cleaning is carried out. Thus, an auxiliary pattern type phase shift mask with the etching mask layer partially left is obtained (FIG. 2, (4)).

As described above, according to this invention, it becomes possible to manufacture the auxiliary pattern type phase shift mask without degrading the quality.

The invention claimed is:

1. A method of manufacturing a phase shift mask having, on a transparent substrate, a main opening formed by partly removing a light-shielding film and an auxiliary opening provided at a peripheral portion of said main opening, said auxiliary opening having a width incapable of being resolved when transferring, wherein the transparent substrate is partly removed in a depth direction such that phases of light passing through the main opening and light passing through the auxiliary opening differ from each other by a predetermined angle, comprising:

a first process including
  a step of preparing a photomask blank having the light-shielding film, a thin film for forming an etching mask layer, and a first resist film which are formed in this order on the transparent substrate,
    said light-shielding film comprising a material being etchable by a fluorine-based etching medium,
    said thin film having a resistance to the fluorine-based etching medium, comprising a metal selected from chromium, tantalum, titanium, aluminum, hafnium, vanadium, or zirconium, an alloy of one or more of said metals, a metal compound containing one or more of oxygen, nitrogen, carbon, fluorine along with one of said metal or alloy,
  a step of exposing a pattern corresponding to the main opening and the auxiliary opening onto the first resist film and then developing to form a first resist pattern, a step of, using said first resist pattern as a mask, etching the thin film to form the etching mask layer, a step of, using the etching mask layer as a mask, etching the light-shielding film, and a step of stripping the remaining first resist pattern, a second process including a step of forming a second resist film on the transparent substrate obtained in the first process, a step of exposing a pattern corresponding to one of the main opening and the auxiliary opening and then developing to form a second resist pattern, a step of, using the second resist pattern as a mask, etching part of the transparent substrate to a depth such that the phases of the light passing through the main opening and the light passing through the auxiliary opening differ from each other by the predetermined angle, and a step of stripping the remaining second resist pattern, and a third process including a step of removing a part of or whole of the etching mask layer.

2. A method of manufacturing a phase shift mask according to claim 1 wherein said thin film comprises chromium.

3. A method of manufacturing a phase shift mask according to claim 1 wherein, in said second process, part of transparent substrate corresponding to said main opening is etched to said depth such that the phases of the light passing through the main opening and the light passing through the auxiliary opening differ from each other by the predetermined angle.

4. A method of manufacturing a phase shift mask according to claim 1 wherein, in said second process, part of transparent substrate corresponding to said auxiliary opening is etched to said depth such that the phases of the light passing through the main opening and the light passing through the auxiliary opening differ from each other by the predetermined angle.

5. A method of manufacturing a phase shift mask according to claim 1 wherein said light-shielding film comprising silicide of molybdenum, tungsten, or tantalum, or a material containing oxygen, nitrogen, carbon, or fluorine along with said silicide.

6. A method of manufacturing a phase shift mask according to claim 1 wherein said light-shielding film has a light semi-transmissivity.

7. A method of manufacturing a phase shift mask according to claim 1 wherein said etching mask layer comprises a material which is etchable by a chlorine-based etching medium.

8. A method of manufacturing a phase shift mask according to claim 1 wherein, the exposing step in the first process is carried out with an electron-beam writing apparatus within ±5 nm of design value.

9. A method of manufacturing a phase shift mask according to claim 1 wherein said phase shift mask comprises a contact hole pattern.

10. A method of manufacturing a phase shift mask according to claim 1 wherein said predetermined angle is 180 degrees.

11. A method of manufacturing a phase shift mask according to claim 1 wherein said light-shielding film has a light semi-transmissivity and, in said third process, a part of the etching mask layer is removed while the other part corresponding to non-transfer region is left on the light-shielding film.

12. A method of manufacturing a phase shift mask according to claim 11 wherein said light-shielding film stacked with said etching mask layer substantially shields exposure light.

13. A method of manufacturing a phase shift mask according to claim 11 wherein said transparent substrate comprises etching stopper film.

* * * * *